US010727072B2

(12) United States Patent
Atikian et al.

(10) Patent No.: US 10,727,072 B2
(45) Date of Patent: Jul. 28, 2020

(54) SYSTEM AND METHOD FOR WAFER-SCALE FABRICATION OF FREE STANDING MECHANICAL AND PHOTONIC STRUCTURES BY ION BEAM ETCHING

(71) Applicant: President and Fellows of Harvard College, Cambridge, MA (US)

(72) Inventors: Haig Avedis Atikian, Somerville, MA (US); Marko Loncar, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 15/572,553

(22) PCT Filed: May 13, 2016

(86) PCT No.: PCT/US2016/032285
§ 371 (c)(1),
(2) Date: Nov. 8, 2017

(87) PCT Pub. No.: WO2016/186988
PCT Pub. Date: Nov. 24, 2016

(65) Prior Publication Data
US 2018/0138047 A1    May 17, 2018

Related U.S. Application Data

(60) Provisional application No. 62/162,058, filed on May 15, 2015.

(51) Int. Cl.
*H01L 21/306* (2006.01)
*H01L 21/3065* (2006.01)
*B81C 99/00* (2010.01)

(52) U.S. Cl.
CPC ...... *H01L 21/3065* (2013.01); *B81C 99/0095* (2013.01); *B81B 2207/053* (2013.01);
(Continued)

(58) Field of Classification Search
CPC ............. H01L 21/3065; B81C 99/0095; B81C 2201/056; B81C 2201/038;
(Continued)

(56) References Cited

U.S. PATENT DOCUMENTS 5,334,283 A    8/1994 Parikh et al.
5,393,375 A    2/1995 McDonald et al.
(Continued)

OTHER PUBLICATIONS

International Search Report and Written Opinion for PCT /US16/ 32285 dated Sep. 16, 2016.

*Primary Examiner* — Duy Vu N Deo
(74) *Attorney, Agent, or Firm* — Peter A. Nieves; Sheehan Phinney Bass & Green PA (57) ABSTRACT

A method for fabrication of free standing mechanical and photonic structures is presented. A resist mask is applied to a bulk substrate. The bulk substrate is attached to a movable platform. The bulk substrate is exposed to an ion stream produced by a reactive ion beam etching source. The platform is moved relative to the ion stream to facilitate undercutting a portion of the bulk substrate otherwise shielded by the mask.

14 Claims, 7 Drawing Sheets

(52) U.S. Cl.
CPC . *B81B 2207/056* (2013.01); *B81C 2201/0143* (2013.01); *B81C 2201/038* (2013.01); *B81C 2201/056* (2013.01)

(58) Field of Classification Search
CPC ...... B81C 2201/0143; B81B 2207/053; B81B 2207/056
See application file for complete search history.

(56) References Cited

U.S. PATENT DOCUMENTS

| | | | | |
|---|---|---|---|---|
| 5,458,733 | A * | 10/1995 | Tessmer | C23C 16/02 216/67 |
| 5,892,641 | A * | 4/1999 | Ishiwata | G11B 5/3906 360/327.1 |
| 7,284,316 | B1 * | 10/2007 | Huai | B82Y 10/00 216/62 |
| 2003/0232179 | A1 * | 12/2003 | Steenblik | B82Y 20/00 428/195.1 |
| 2010/0065941 | A1 | 3/2010 | Wells et al. | |
| 2011/0036818 | A1 | 2/2011 | Lee et al. | |
| 2013/0059449 | A1 | 3/2013 | Hautala et al. | |
| 2013/0118896 | A1 * | 5/2013 | Foster | C23F 4/00 204/192.34 |
| 2013/0306596 | A1 | 11/2013 | Fukaya et al. | |
| 2015/0036975 | A1 * | 2/2015 | Burek | G02B 6/136 385/31 |

* cited by examiner

SYSTEM AND METHOD FOR WAFER-SCALE FABRICATION OF FREE STANDING MECHANICAL AND PHOTONIC STRUCTURES BY ION BEAM ETCHING

CROSS-REFERENCE TO RELATED APPLICATIONS

This application is a national stage entry of International Application No. PCT/US16/32285, filed May 13, 2016, which claims the benefit of U.S. Patent Application No. 62/162,058, filed May 15, 2015. The contents of these prior applications are incorporated by reference herein in their entirety.

FIELD OF THE INVENTION

The present invention relates to nanostructures, and more particularly, is related to fabrication of free standing mechanical and photonic structures.

BACKGROUND OF THE INVENTION

Freestanding nanostructures have many applications in the fields of photonics and mechanics. For photonic devices, refractive index contrast is needed to confine an optical mode. For silicon devices, technologies such as silicon-on-insulator (SOI) can be utilized to achieve refractive index contrast where a high quality silicon device layer is supported by a low index substrate. For nanomechanical resonators and oscillators, mechanical freedom for motion is also desirable. Undercutting a supporting substrate using selective etching can create freestanding nanostructures for thin film on insulator technologies. However, for several materials such as diamond, lithium niobate (LiNbO3), silicon carbide (SiC), and gallium nitride (GaN), to name a few, high quality thin film heterolayers are not readily available. Wafer-scale polycrystalline thin films are available for several materials (diamond in particular) where thin films are grown directly on disparate substrates. However these films tend to have inferior properties, both optically and mechanically, due to grain boundaries, surface roughness, and inherent film stress.

An alternative approach to realize nanoscale photonic and mechanical devices is to fabricate devices starting from the bulk material. Typical fabrication of such structures employs a technique called reactive ion etching (RIE). In RIE, a plasma is ignited in a chamber using strong radio frequency (RF) electromagnetic fields. The oscillating field strips the process gas of its electrons creating a plasma. A direct current (DC) bias is then established at a sample (target) and as a result of the voltage difference, ions are accelerated towards the sample chemically and mechanically etching the sample. Techniques exist whereby modulating the etch chemistry by varying RF power or gas pressure can create undercuts to produce freestanding structures. However such techniques are difficult to reproduce consistent device cross sections and limit the final geometry one can fabricate.

Another technique utilizes placing a sample within a Faraday cage placed inside the RIE chamber where the cage electrically isolates the interior of the cage from the electromagnetic field produced by the RF generators. The Faraday cage typically consists of a fine metal mesh where ions are still physically able to pass through, however the field within the metal mesh is drastically attenuated and altered. Therefore ions incident on the cage are accelerated along a path perpendicular to the Faraday cage and ultimately reach the sample of interest to perform the etching function. However due to the physical size of the Faraday cage inside the RIE chamber, the uniformity of the incident ions drastically vary even along short distances (i.e. several 10s of microns). This leads to difficultly in producing identical devices along a sample of several millimeters. Therefore, due to the physical size of the Faraday cage, it's not feasible to perform this type of etching on a wafer scale. Other techniques to achieve similar devices include crystal ion-slicing or focused ion beam milling. In both cases there is appreciable ion damage to the device layer, which again significantly limits the performance of the resulting devices. Therefore, there is a need in the industry to address one or more of the above mentioned issues.

SUMMARY OF THE INVENTION

Embodiments of the present invention provide a system and method for wafer-scale fabrication of free standing mechanical and photonic structures by ion beam etching. Briefly described, the present invention is directed to a method for fabrication of free standing mechanical and photonic structures. A resist mask is applied to a bulk substrate. The bulk substrate is attached to a movable platform. The bulk substrate is exposed to an ion stream produced by a reactive ion beam etching source. The platform is moved relative to the ion stream to facilitate undercutting a portion of the bulk substrate otherwise shielded by the mask.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principals of the invention.

DETAILED DESCRIPTION

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used within this disclosure, "plasma" refers to an electrically conductive gas where the density of ions and electrons are approximately equal.

As used within this disclosure, an "ion beam source" refers a plasma source having a set of grids (ion optics) that enable extraction of a stream of ions.

Reference will now be made in detail to embodiments of the present invention, examples of which are illustrated in the accompanying drawings. Wherever possible, the same reference numbers are used in the drawings and the description to refer to the same or like parts.

Exemplary embodiments herein disclose a fabrication method to realize nano-photonic and nano-mechanical structures on a wafer scale using reactive ion beam milling. An ion milling system includes a discharge chamber where an RF or DC generator strikes a plasma with the process gas. The ions are then electrostatically accelerated with a grid and collimated through ion optics. The energy of the ions leaving the discharge chamber is roughly equal to the beam voltage, and the ion current is equal to the amount of ions drawn out and collimated from the discharge chamber via the ion optics.

The ion source used for the ion mill be one various sizes providing beam dimensions of varying diameters as appropriate to the application, for example, but not limited to a range from 4 cm to 22 cm. The acceleration voltage of the ion mill source defines the ratio between mechanical and chemical etching when using a reactive gas. The etch is more mechanical with higher voltages. Similarly, increasing voltage reduces selectivity one would expect with the etch mask. The acceleration voltage and the beam current are similar for different sources. As an example, using a 10 cm gun for a diamond substrate using an HSQ mask with a beam voltage of 200V and acceleration voltage of 23V may provide suitable etching performance in regards to mask selectivity using an HSQ or titanium mask, with a limit of 85 mA on the beam current. Such an inductively coupled plasma (ICP) ion source may be fed with 50 sccm of $O_2$ at 150 W RF power to generate the oxygen plasma. A non-immersed neutralizer may be used to add electrons to the extracted ion beam, the electrons typically having about 1.25 times that of the beam current, in this example, the neutralizer may be set to 120 mA. The tilt of the stage (platform) may be adjusted to achieve whichever desired angle of undercut one would want in the final device, for a non-limiting example, platform tilts of 20 degrees to 70 degrees.

The discharge chamber may produce ions by subjecting a gas, such as argon, to an radio frequency (RF) field. For example, an alumina or quartz chamber having a surrounding RF-powered coil may intake a fed gas. Free electrons are excited by the RF field within the discharge chamber until they have enough energy to break gas atoms into ions and electrons that can further ionize gas atoms ensuring that the gas is thus ionized and a plasma is established.

Figure 1:
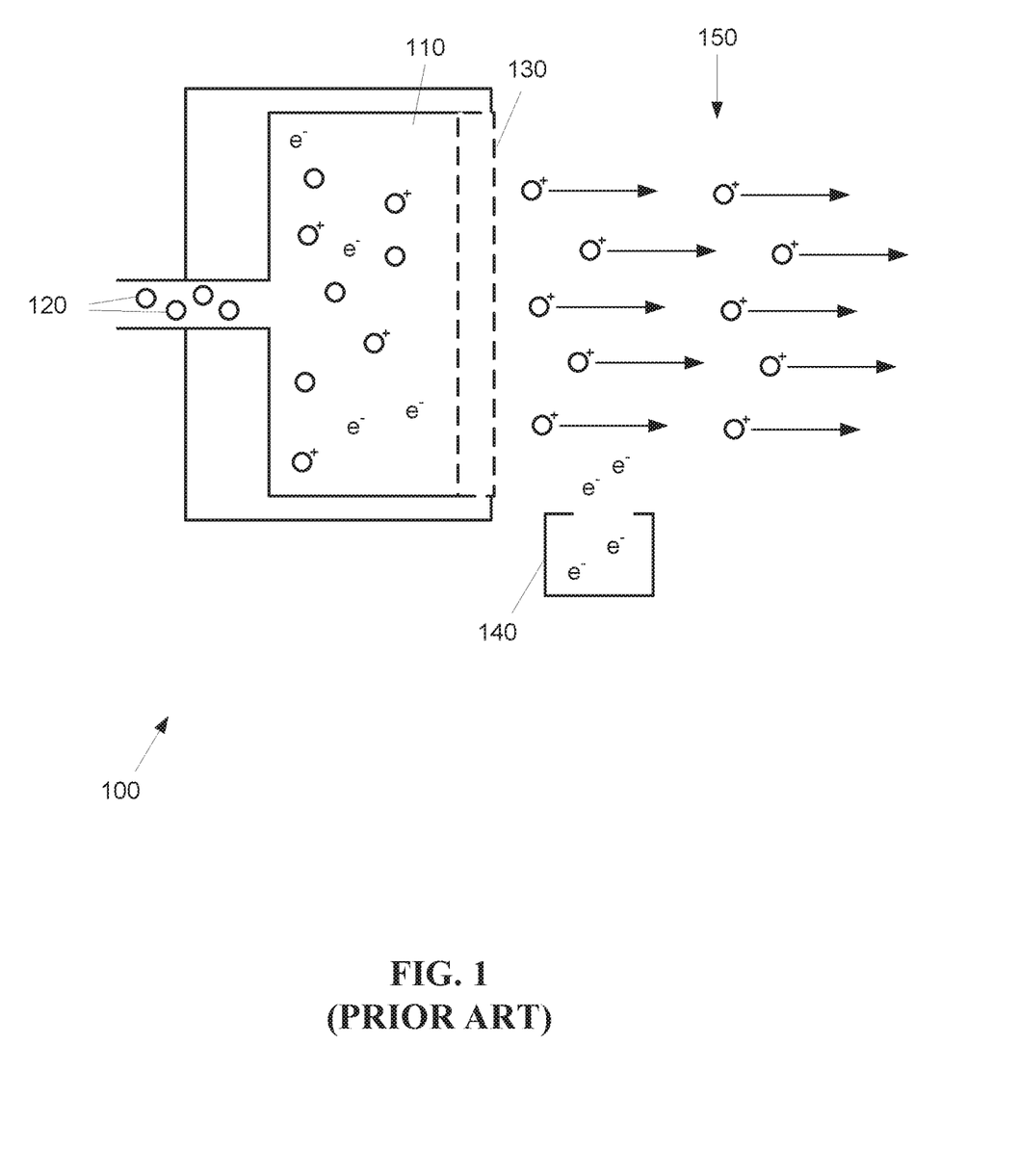
FIG. 1 is a schematic diagram of a prior art ion source.

The discharge chamber may be a component of an ion beam source 100, such as an "ion gun," as shown in FIG. 1. A source gas 120 is introduced into the discharge chamber 110. An electron source within the discharge chamber 110 is used to ionize the gas and establish a plasma. Ions created in the discharge chamber 110 are accelerated to high velocity, for example, by a charged grid having electrostatic apertures. The ions are collimated with ion optics 130 to form an ion stream 150. A neutralizer 140 downstream from the ion beam source 100 emits electrons to balance the number of positive ions that leave the ion beam source 100.

Different embodiments may use different types of ion beam sources 100. In general, the ion beam source 100 is defined by the discharge chamber 110, an electron source within the discharge chamber 110, and the neutralizer 140. For direct current (DC) ion beam sources 100, the discharge chamber 110 is referred to as the body. The body may have a magnetic field produced, for example, by permanent magnets. For DC sources, the electron source may be, for example, a hot filament or a hollow cathode disposed within the discharge chamber 110. Electrons from the electron source are used to ionize the source gas 120. For DC sources, the neutralizer 140 may be, for example, a hot filament, hollow cathode, or plasma bridge (PBN).

For radio frequency antenna (RF) sources, the discharge chamber 110 generally consists of a dielectric material permeable to the RF field produced by an antenna. The RF field ionizes the source gas 120 introduced within the discharge chamber 110. For RF sources, the RF field energizes free electrons. The energetic electrons have ionizing collisions with the source gas 120 thereby producing ions and additional electrons. For RF sources, the neutralizer 140 may be either a PBN or an RF neutralizer (RFN). For example, a non-immersed neutralizer injects electrons into the ion beam external to the ion beam source 100, and produces collimated and accelerated oxygen atoms for etching.

DC sources are based on an older technology than RF sources. DC ion beam sources are used in ion beam etching (IBE). For example, IBE may involve irradiating a sample with Ar ions. IBE etching is mechanical and typically has poor etch selectivity with the mask. While DC ion beam sources 100 work with inert gasses, for example, argon, they are not appropriate for reactive gasses, for example, oxygen or fluorine.

RF ion beam sources can use reactive gasses for reactive ion beam etching (RIBE) and reactive ion beam assisted etching (RIBAE). RIBE involves irradiating the sample with ions that chemically react with the sample. RIBAE is a technique where a reactive gas is injected into the ion beam incident on the sample.

Figure 2A:
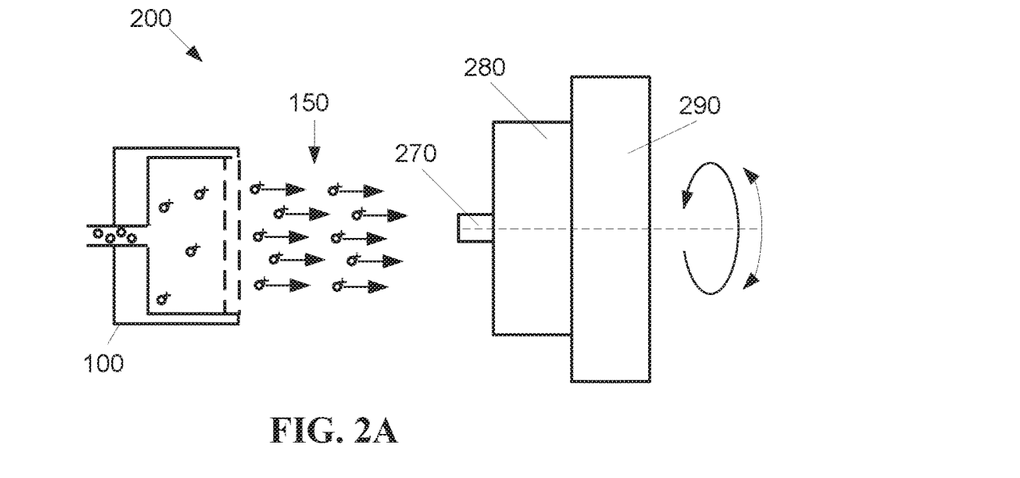
FIG. 2A is a schematic diagram of a first embodiment of an ion miller showing a work piece at the start of milling.

The ion beam source 100, along with a platform stage 290, form a first exemplary embodiment of a milling tool 200 employing RIBE, as shown by FIG. 2A. A work piece 280, for example, a substrate of a material to be milled, is mounted on a platform stage 290, and exposed to the ion stream 150 from the ion beam source 100. The platform stage 290 may be moved to orient the work piece 280 appropriately for the desired milling operation. For example, the platform stage 290 may be tilted at an angle with respect to the ion beam source 100, and/or the platform stage 290 may be rotated with respect to the ion beam source 100. The platform stage 290 may be laterally displaced in a plane substantially horizontal to the ion stream 150.

The ion flow from the ion beam source 100 may be increased or decreased, for example, depending upon the orientation and/or position of the platform stage 290. The platform stage 290 and/or the operation of the ion beam source 100 may be controlled, for example, by a computerized controller, described further below. One or more resist masks 270 may be used to mask portions of the work piece 280 from being etched by the ion stream 150.

Figure 2B:
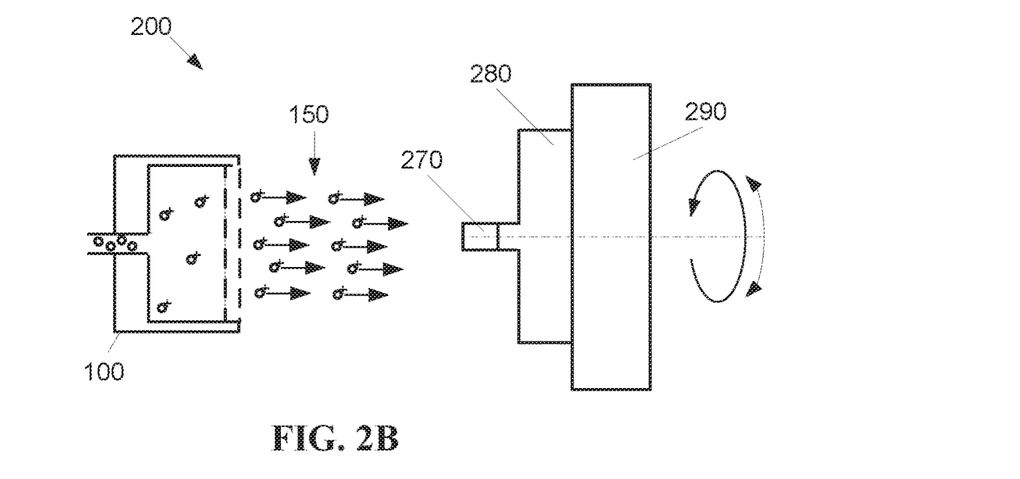
FIG. 2B is a schematic diagram of a first embodiment of an ion miller showing the work piece during milling.
Figure 2C:
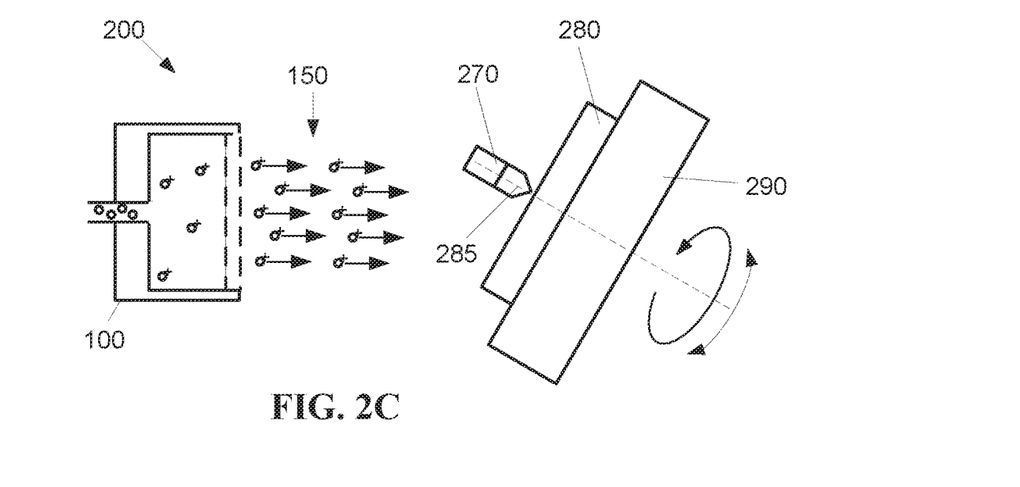
FIG. 2C is a schematic diagram of a first embodiment of an ion miller showing undercutting of the work piece.

To achieve freestanding structures, a multiple step RIBE process depicted in FIGS. 2A-2C is employed. The work piece 280 material may be, for example diamond. FIG. 2A shows an ion beam 150, for example, an oxygen ion beam 150 produced by the ion beam source 100 incident on the diamond substrate work piece 280. The work piece 280 includes a mask 270 consisting of, for example, Hydrogen silsesquioxane ebeam resist (HSQ). HSQ may be spin coated onto the work piece 280, for example, with an adhesion layer such as titanium.

Other materials may be used for the mask 270. For example, titanium is a suitable mask for etching diamond using an oxygen. A titanium mask 270 may be defined using a nanofabrication process called lift-off, however these masks tend to create rough features. Preferably a Titanium mask uses another ebeam resist such as PMMA or HSQ to define a pattern. This pattern is then transferred into the titanium via another etch chemistry, for example by transferring a pattern into titanium or chromium using a Chlorine plasma using the ebeam masks as mentioned above. The titanium then serves as the etch mask 270 for the work piece 280.

An appropriate mask 270 should be chosen for the etch depending upon the etch appropriate for the ion etching. For example, for etching silicon using this technique, a mask 270 that is suitable to use in a fluorine plasma such as fluorine based plasmas, for example $SF_6$ or $CHF_3$ may be chosen.

FIG. 2B shows the diamond work piece 280 after a sufficient top down etching process, where the ion beam 150 is perpendicular to the work piece 280. FIG. 2C shows a nano structure 285 freed from the work piece 280 by an undercut achieved by tilting the platform 290 and the work piece 280 with respect to the ion beam 150 while simultaneously rotating the platform stage 290 to achieve uniform undercut of the device in all directions. By tilting the platform 290, the ion beam 150 is directed to a portion of the work piece 280 that is otherwise shielded from the ion beam 150 by the mask 270 when the platform 290 is not tilted. Tilting the platform 290 allows for undercutting the work piece 280 beneath the mask. Rotation of the platform 290 provides substantially uniform undercut of the nanostructure 285 from all directions. The angle of the undercut can be accurately controlled by the angle of the stage (platform) tilt.

While FIGS. 2A-2C show etching of a single nanostructure 285 for simplicity, the illustrated technique can be used to simultaneously mill multiple nanostructures 285. The ion beam source 100 may produce an ion beam 150 with a large diameter, for example, a diameter of up to 10 inches or greater. Etch uniformity for nanostructures 285 across the work piece 280 may be highly consistent across long distances on the order of the ion beam 150 diameter. Further, the relative density of the ion beam 150 is generally consistent across the area of the work piece 280, for example, within 5% of the average ion beam density.

Figure 3A:
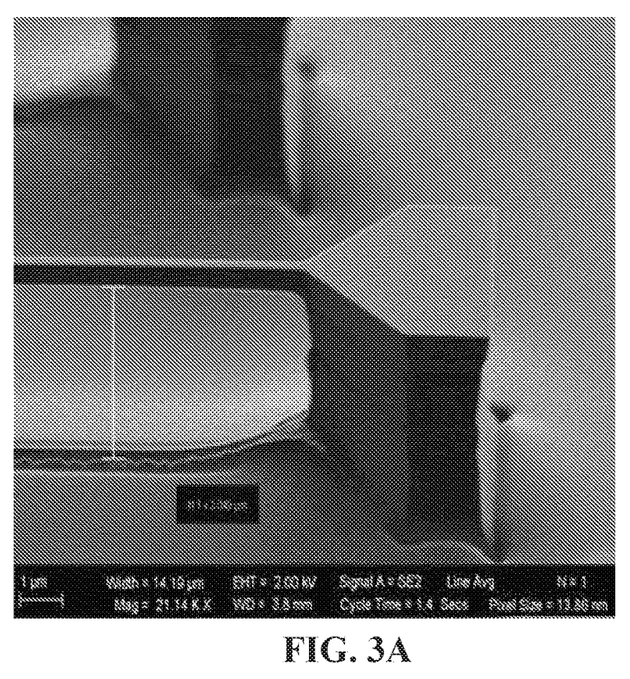
FIG. 3A is a scanning electron microscopy (SEM) image showing a first view of a freestanding structure.
Figure 3B:
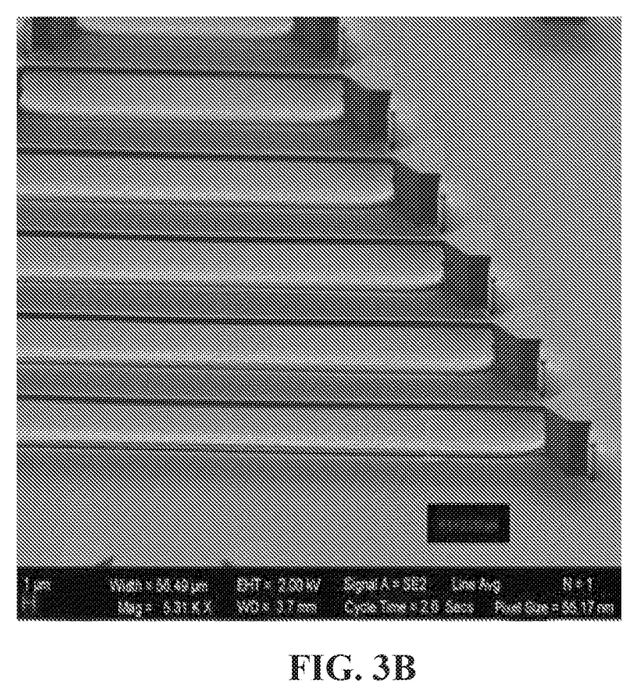
FIG. 3B is an SEM image showing a second view of a freestanding structure.

FIGS. 3A-B show a scanning electron microscopy (SEM) image of a freestanding structure etched with this technique, producing freestanding triangular cross section beams from a bulk diamond substrate with a large pad on either end to support it off of the substrate.

Advantages of the first embodiment of the ion milling tool include that the energy of the ions are substantially uniform since the energy is distinctly set they the acceleration voltages of the ion optics 130 (FIG. 1). Also the beam current can be very accurately monitored and set by the extraction rate from the discharge chamber 110 (FIG. 1). This ultimately leads to very controlled and extremely reproducible etch rates.

Figure 4:
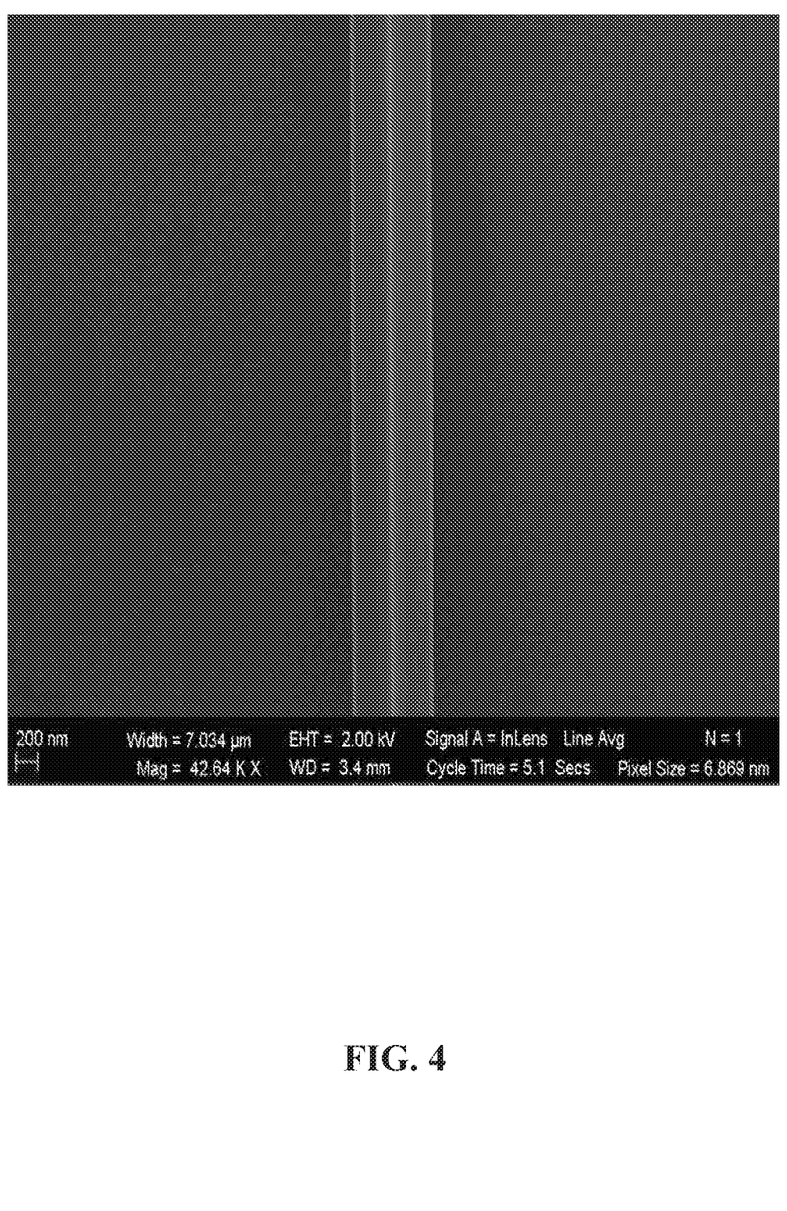
FIG. 4 is an SEM image of the underside of a diamond triangular cross section beam.

Under the first embodiment, the etch produces highly uniform structure well across the length of the sample, in this case a 4 mm×4 mm diamond sample. The uniformity of the etch can clearly be seen by examining the underside of the freestanding beam. This is done by a stamp transferring these freestanding structures, flipping the sample upside down and stamping the beams into a thin film of silver. The beams break off from the supporting structures and embed into the silver to allow for easy inspection. FIG. 4 shows a SEM of the underside of a diamond triangular cross section beam showing the symmetry of the etching technique, along with the extremely smooth side walls of the etch. The beams have extremely smooth side walls as a consequence of the etching technique. The uniformity of the etch can also be seem by examining the symmetry of the triangular cross section more easily seen in FIG. 5 with measurement annotations.

Figure 6:
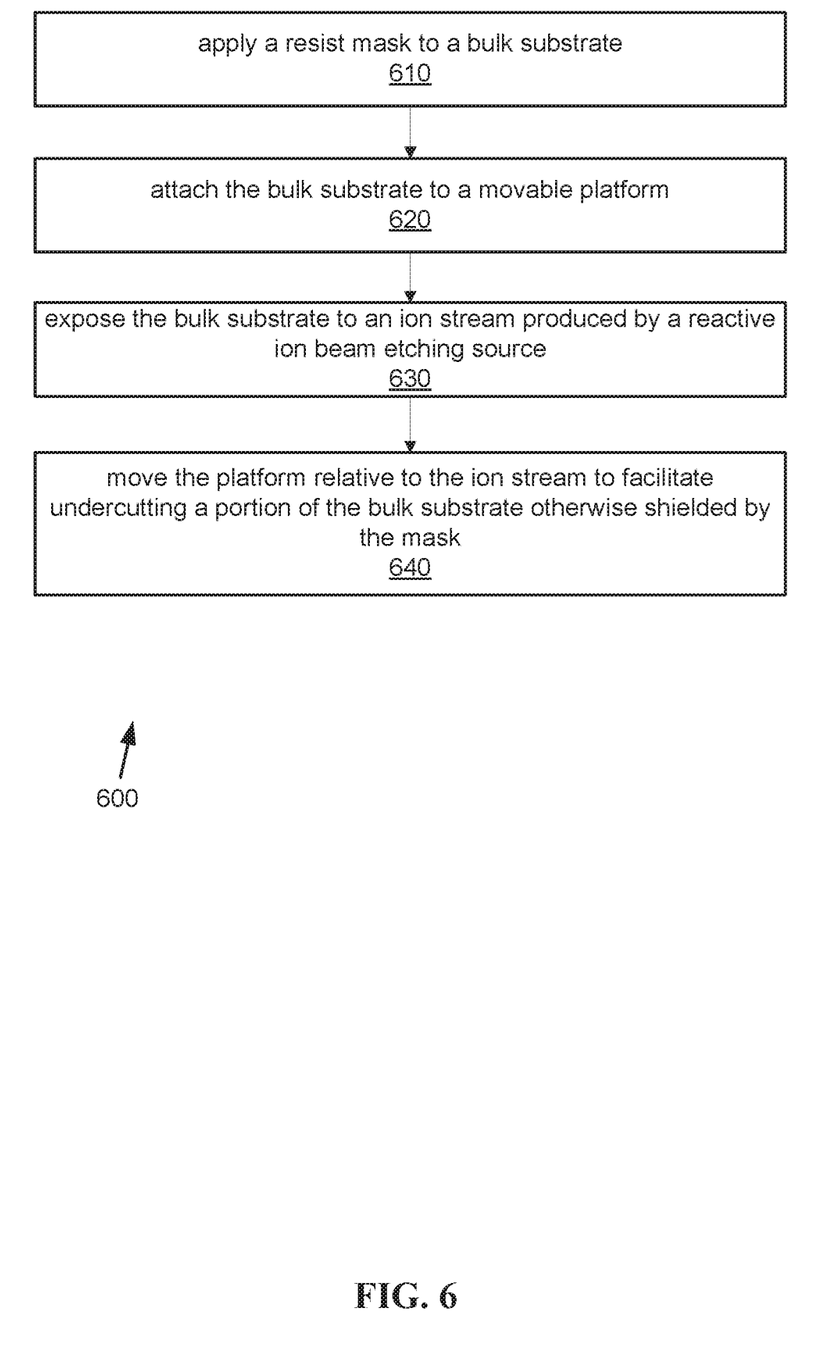
FIG. 6 is a flowchart of an exemplary method for milling a nanostructure.
Figure 7:
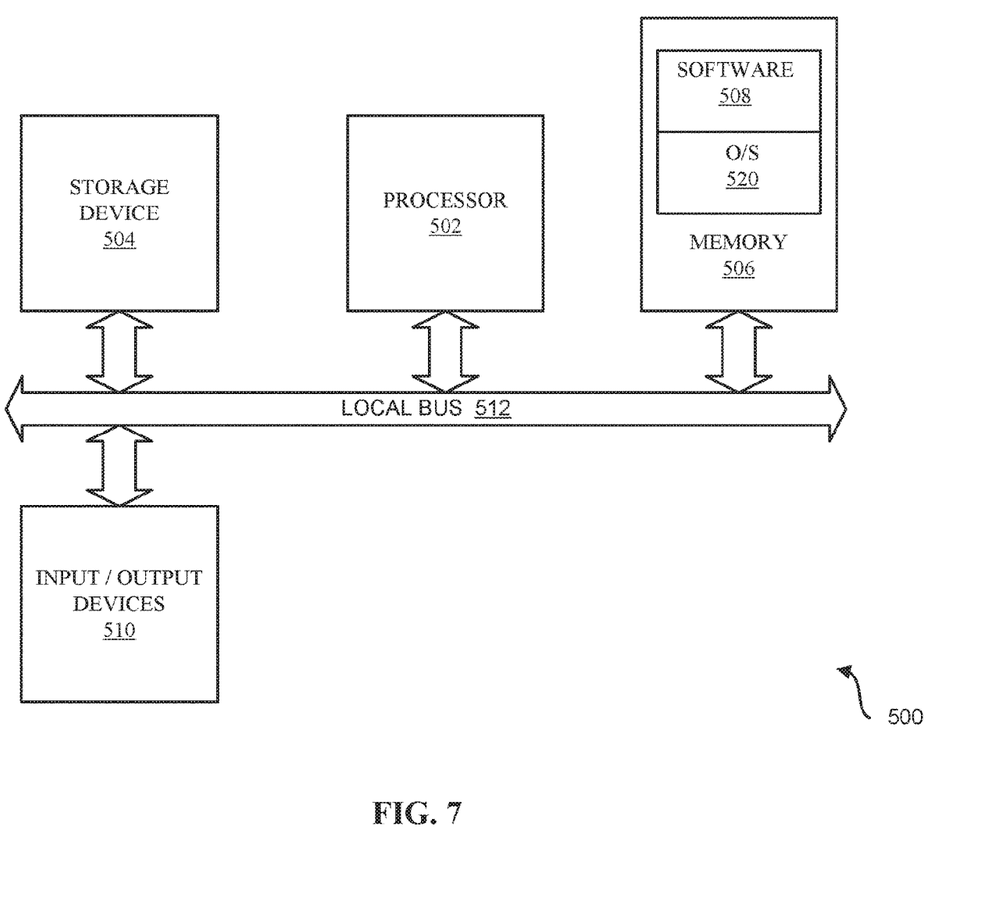
FIG. 7 is a schematic diagram illustrating an example of a system for executing functionality of the present invention.

FIG. 6 is a flowchart of an exemplary embodiment of a method for etching a nanostructure. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The method is described with reference to FIGS. 2A-2C.

A resist mask 270 is applied to a workpiece 280, in this case, bulk substrate 280, as shown by block 610. The bulk substrate 280 is attached to a movable platform 290, as shown by block 620. The bulk substrate 280 is exposed to an ion stream 150 produced by a reactive ion beam etching source 100, as shown by block 630. The platform 290 is moved relative to the ion stream 150 to facilitate undercutting a portion of the bulk substrate 280 otherwise shielded by the mask 270, as shown by block 640.

Figure 5:
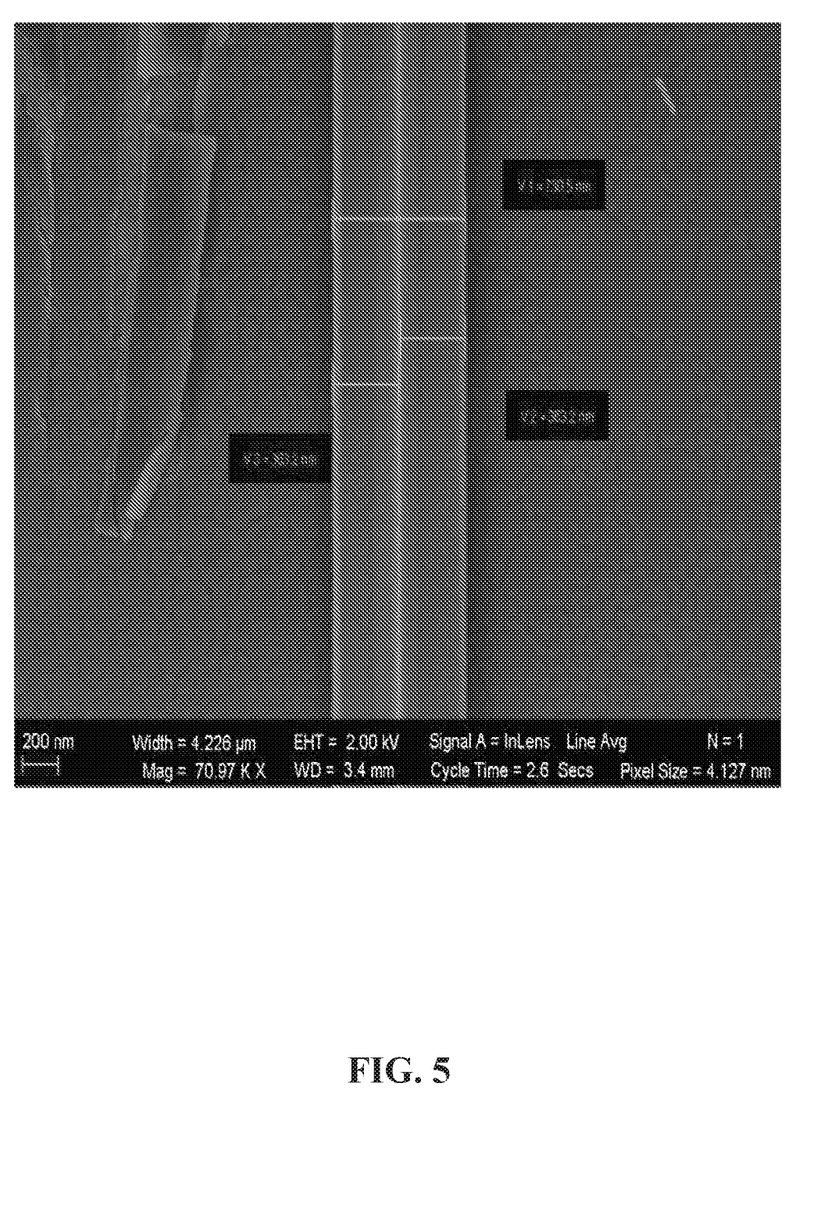
FIG. 5 is an SEM of the underside of a diamond triangular cross section beam with measurement annotations showing the symmetry of the structure.

As previously mentioned, the platform and/or ion beam source for executing the functionality described in detail above may be controlled by a computer, an example of which is shown in the schematic diagram of FIG. 5. The system 500 contains a processor 502, a storage device 504, a memory 506 having software 508 stored therein that defines the abovementioned functionality, input and output (I/O) devices 510 (or peripherals), and a local bus, or local interface 512 allowing for communication within the system 500. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

When the functionality of the system 500 is in operation, the processor 502 is configured to execute the software 508 stored within the memory 506, to communicate data to and from the memory 506, and to generally control operations of the system 500 pursuant to the software 508. The operating system 520 is read by the processor 502, perhaps buffered within the processor 502, and then executed.

When the system 500 is implemented in software 508, it should be noted that instructions for implementing the system 500 can be stored on any computer-readable medium for use by or in connection with any computer-related device, system, or method. Such a computer-readable medium may, in some embodiments, correspond to either or both the memory 506 or the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system 500 is implemented in hardware, the system 500 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The above embodiments may be used to produce freestanding undercut structures, and for mechanically releasing a structure from a substrate. Applications include creating an optical confinement (index contrast) material with different indexes of refraction, having a high index core to contain the light and a lower index cladding around the light to produce photonic application. The embodiments allow production of nano scale free standing mechanical structures from bulk material, such as diamond, or quartz (silicon dioxide). The structure produced may range from 100 nm or smaller up to several microns.

While the above embodiments were described using RIBE, in alternative embodiments RIBAE may use a DC source as well with similar results. In RIBAE the ions from the inert gas (Argon) leave the gun and a reactive gas is added external to the gun. The high kinetic energy of the collimated ions from the gun ionize the inject gas and accelerate them towards the sample in a similar manner as the RIBE embodiments, with perhaps less efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for simultaneous fabrication of multiple free standing mechanical and photonic structures, comprising the steps of:

applying a resist mask to a bulk substrate;

attaching the bulk substrate to a movable platform;

forming with a collimated reactive ion beam etching (RIBE) source a RIBE ion stream comprising ions that chemically react with the bulk substrate material;

collimating the RIBE ion stream via ion optics;

exposing the bulk substrate to the RIBE ion stream directed at the movable platform; and moving the platform relative to the ion stream to facilitate undercutting a portion of the bulk substrate otherwise shielded by the mask to simultaneously mill multiple nanostructures with the RIBE ion stream.

2. The method of claim 1, wherein the bulk substrate comprises diamond.

3. The method of claim 1, wherein moving the platform comprises laterally displacing the platform in a plane substantially parallel to the ion stream.

4. The method of claim 1, wherein moving the platform comprises tilting the platform relative to a plane substantially parallel to the ion stream.

5. The method of claim 4, wherein a tilt angle of the platform relative to the ion stream is in the range of 10 degrees to 80 degrees.

6. The method of claim 4, wherein moving the platform further comprises rotating the platform relative to the ion stream.

7. The method of claim 3, further comprising the step of adjusting the ion stream according to the orientation and/or position of the platform relative to the ion stream.

8. The method of claim 1, wherein the ion stream comprises oxygen ions, and the substrate comprises diamond.

9. The method of claim 1, wherein the ion stream comprises fluorine ions, and the substrate comprises quartz.

10. The method according to claim 1, wherein the ion stream produced by the collimated reactive ion beam etching source comprises a beam diameter in the range of 4 cm to 22 cm.

11. The method according to claim 6, wherein the ion stream produced by the collimated reactive ion beam etching source comprises a beam diameter in the range of 4 cm to 22 cm.

12. A method for simultaneous fabrication of multiple free standing mechanical and photonic structures, comprising the steps of:

applying a resist mask to a bulk substrate;

attaching the bulk substrate to a movable platform;

forming with a collimated reactive ion beam etching (RIBE) source a RIBE ion stream comprising ions that chemically react with the bulk substrate material;

collimating the RIBE ion stream via ion optics;

exposing the bulk substrate to the RIBE ion stream directed at the movable platform;

top down etching the substrate, wherein the ion beam is perpendicular to a top surface of the substrate; and moving the platform relative to the ion stream to facilitate undercutting a portion of the bulk substrate otherwise shielded by the mask to simultaneously mill multiple nanostructures with the RIBE ion stream.

13. The method of claim 12, wherein moving the platform comprises laterally displacing the platform in a plane substantially parallel to the ion stream and tilting the platform relative to a plane substantially horizontal to the ion stream in the range of 10 degrees to 80 degrees.

14. The method of claim 13, wherein moving the platform further comprises rotating the platform relative to the ion stream.

* * * * *